United States Patent
Abbasi et al.

(10) Patent No.: US 6,903,586 B2
(45) Date of Patent: Jun. 7, 2005

(54) GAIN CONTROL CIRCUITRY FOR DELAY LOCKED LOOP CIRCUIT

(75) Inventors: Saeed Abbasi, Norborth, PA (US); Martin E. Perrigo, Newtown, PA (US); Carol A. Price, Jamison, PA (US)

(73) Assignee: ATI Technologies, Inc., Thornhill (CA)

( * ) Notice: Subject to any disclaimer, the term of this patent is extended or adjusted under 35 U.S.C. 154(b) by 0 days.

(21) Appl. No.: 10/463,391

(22) Filed: Jun. 17, 2003

(65) Prior Publication Data

US 2004/0169537 A1 Sep. 2, 2004

Related U.S. Application Data

(63) Continuation-in-part of application No. 10/376,817, filed on Feb. 28, 2003.

(51) Int. Cl.[7] ................................................. H03L 7/06
(52) U.S. Cl. ........................................ 327/158; 327/149
(58) Field of Search ................................ 327/149, 158, 327/161, 153; 331/10, 25

(56) References Cited

U.S. PATENT DOCUMENTS

| | | | |
|---|---|---|---|
| 5,629,651 A | 5/1997 | Mizuno ........................ 331/34 |
| 5,699,020 A | 12/1997 | Jefferson ...................... 331/17 |
| 5,939,949 A | 8/1999 | Olgaard et al. ............... 331/17 |
| 5,986,485 A | 11/1999 | O'Sullivan ................... 327/156 |
| 5,994,934 A | 12/1999 | Yoshimura et al. .......... 327/158 |
| 6,043,717 A | 3/2000 | Kurd ............................ 331/17 |
| 6,127,865 A | 10/2000 | Jefferson ..................... 327/149 |
| 6,127,866 A | 10/2000 | Chu et al. .................... 327/158 |
| 6,184,753 B1 | 2/2001 | Ishimi et al. ................. 331/34 |
| 6,232,806 B1 | 5/2001 | Woeste et al. ............... 327/149 |
| 6,285,725 B1 | 9/2001 | Sung et al. ................... 375/374 |
| 6,329,882 B1 * | 12/2001 | Fayneh et al. ................ 331/10 |
| 6,411,142 B1 | 6/2002 | Abbasi et al. |
| 6,556,088 B1 * | 4/2003 | Dietl et al. .................... 331/17 |
| 6,646,512 B2 | 11/2003 | Abassi et al. ................. 331/17 |
| 2002/0067214 A1 | 6/2002 | Abbasi et al. ................ 331/17 |
| 2003/0057449 A1 * | 3/2003 | Hirabayashi ................ 257/200 |
| 2004/0051576 A1 * | 3/2004 | Zhang et al. ............... 327/276 |

OTHER PUBLICATIONS

Sidiropoulos, Stefanos et al., "Adaptiev Bandwidth DLLs and PLLs using Regulated Supply CMOS Buffers," 2000 Symposium on VLSI Circuits Digest of Technical Papers, 4 pp., 2000.

Randall W. Rhea, "Designing a Low–Noise VCO on FR4," RF Tutorial, www.rfdesign.com, 4 pp., Sep. 1999.

R. Jacob Baker, et al., "CMOS: Circuit Design, Layout, and Simulation," IEEE Press Series onMicroelectronic Systems, pp. 417–423, IEEE, New York.

John G. Maneatis, "Low–Jitter Process–Independent DLL and PLL Based on Self–Biased Techniques, " IEEE Journal of Solid–State Circuits, vol. 31, No. 1, pp. 1723–1732.

David Johns, et al., "Analog Integrated Circuit Design," University of Toronto, pp. 675–679.

* cited by examiner

*Primary Examiner*—Linh My Nguyen
(74) *Attorney, Agent, or Firm*—Toler, Larson & Abel, LLP (57) ABSTRACT

A delay locked loop (DLL) circuit having gain control is presented. The DLL circuit includes a bias generator responsive based on an error signal to produce first and second bias voltages to control a plurality of differential delay elements. The bias generator includes a bias current generator having a fixed voltage-controlled current source and a dynamic voltage-controlled current source to generate a bias current, and a bias voltage generator for receiving the bias current and generating first and second bias voltages. The bias generator can generate multiple current levels in different modes of operation. Each of the current levels of the bias generator allows a small range of currents and therefore small values of gain factors ($K_{VCDL}$). Low $K_{VCDL}$ values leads to lower jitter and better control over feedback stability, resulting in an increase in the range of operational frequencies.

34 Claims, 9 Drawing Sheets

LOCK CIRCUIT

*FIG. 3A*

STATE DIAGRAM

*FIG. 3B*

| UP | DOWN | Q1 | Q2 | Q3 |
|---|---|---|---|---|
| 0 | 0 | 0 | 0 | 0 |
| 0 | 1 | 0 | 1 | 0 |
| 1 | 1 | 0 | 1 | 0 |
| 0 | 0 | 0 | 1 | 0 |
| 0 | 1 | 0 | 1 | 0 |
| 1 | 1 | 0 | 1 | 0 |
| ... | ... | ... | ... | 0 |
| 0 | 0 | 0 | 1 | 0 |
| 1 | 0 | 1 | 1 | 1 |
| 1 | 1 | 1 | 1 | 1 |
| 1 | 1 | 1 | 1 | 1 |
| ... | ... | ... | ... | 1 |
| 0 | 0 | 1 | 1 | 1 |
| 0 | 1 | 1 | 1 | 1 |
| 1 | 1 | 1 | 1 | 1 |
| ... | ... | ... | ... | 1 |
| 0 | 0 | 1 | 1 | 1 |
| 1 | 0 | 1 | 1 | 1 |
| 1 | 1 | 1 | 1 | 1 |
| ... | ... | ... | ... | 1 |

EXAMPLE OF LOCK PROCESS

DELAY LINE WITH DELAY CELL SWITCHING CIRCUIT

DLL FLOW DIAGRAM

GAIN CONTROL CIRCUITRY FOR DELAY LOCKED LOOP CIRCUIT

CROSS-REFERENCE TO RELATED APPLICATION(S)

This application is a continuation in part of U.S. patent application Ser. No. 10/376,817 entitled "SYSTEM FOR PHASE LOCKED LOOP OPERATION AND METHOD THEREOF" by Abbasi et al. filed on Feb. 28, 2003, whose disclosure is incorporated herein by reference.

This application is related to U.S. Pat. No. 6,411,142 entitled "COMMON BIAS AND DIFFERENTIAL STRUCTURE BASED DLL WITH FAST LOCKUP CIRCUIT AND CURRENT RANGE CALIBATION FOR PROCESS VARIATION" issued Jun. 25, 2002.

This application is related to U.S. patent application Ser. No. 09/730,954 entitled "COMMON BIAS AND DIFFERENTIAL STRUCTURE BASED PLL WITH FAST LOCKUP CIRCUIT AND CURRENT RANGE CALIBRATION FOR PROCESS VARIATION" filed on Dec. 6, 2000 (now U.S. Pat. No. 6,646,512 issued Nov. 11, 2003).

BACKGROUND

The present disclosure relates generally to delay locked loop (DLL) circuits. More particularly, this disclosure relates to a DLL circuit which is based on a variable length plurality of differential delay elements, an advanced common biasing technique which tolerates process variations and calibrates current ranges for operational variances and lock detection for faster processing.

Delay-locked loops are often used in the I/O interfaces of digital integrated circuits in order to hide clock distribution delays and to improve overall system timing. In recent years, the demand has risen for devices capable of high-speed processing. As a result, the demand for DLL circuits that quickly compensate for electronic noise and capacitive delays has also risen.

Figure 1:
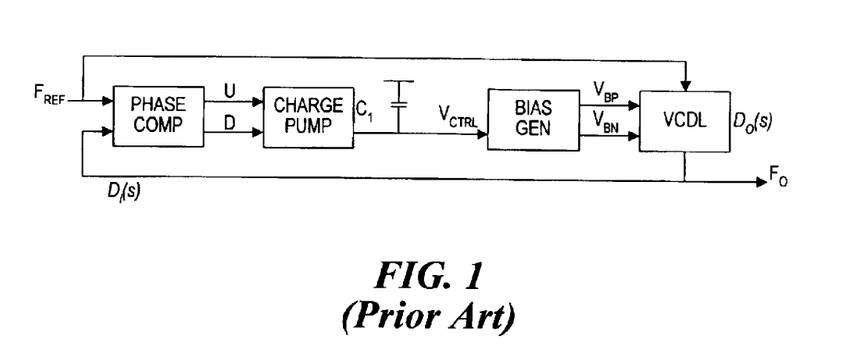
FIG. 1 is a block diagram of a typical DLL circuit.

One type of design used by those skilled in the art to minimize the noise present in the circuit at the required speed is a self-bias signal technique. Referring to FIG. 1, this prior art DLL circuit is a self-biasing configuration that is composed of a phase comparator, charge pump, loop filter, bias generator and a plurality of delay cells. In this configuration, devices dependent on a precisely delayed clock signal must delay processing for a standardized time period to insure that the received signal is exact. This processing delay is caused by the fact that most DLL circuits are designed to tolerate the worst-case conditions. The DLL circuit performance during this worst-case condition is the processing delay time set for most devices using the output of this circuit.

This prior art design uses a constant charge pump current which gives rise to a constant damping factor and a constant loop bandwidth. A constant bandwidth can constrain the achievement of a wide operating frequency range and low input tracking jitter. If the frequency is disturbed, the phase error that results from each cycle of the disturbance will accumulate for many cycles until the loop can compensate for the phase error. The error will be accumulated for a number of cycles, which is proportional to the operating frequency divided by the loop bandwidth. Thus the loop bandwidth would have to be positioned as close as possible to the reference frequency bandwidth to minimize the total phase error. The result is that the frequency bandwidth must be conservatively set for stability at the lowest operating frequency with worst case process variations rather than set for optimized jitter performance. The self-biased DLL also exhibits much faster locking times only when locking from similar or higher operating frequencies. However, if the self-biased DLL is started at a very low operating frequency, it will exhibit very slow locking times.

Accordingly, there is a need for a DLL circuit which provides a fast lock-up circuit, has better jitter performance, tolerates process variations, reduces power consumption, reduces processing delay time and extends the DLL operating frequency range.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The first embodiment of the present disclosure will be described with reference to the drawing figures wherein like numerals represent like elements throughout.

Figure 2:
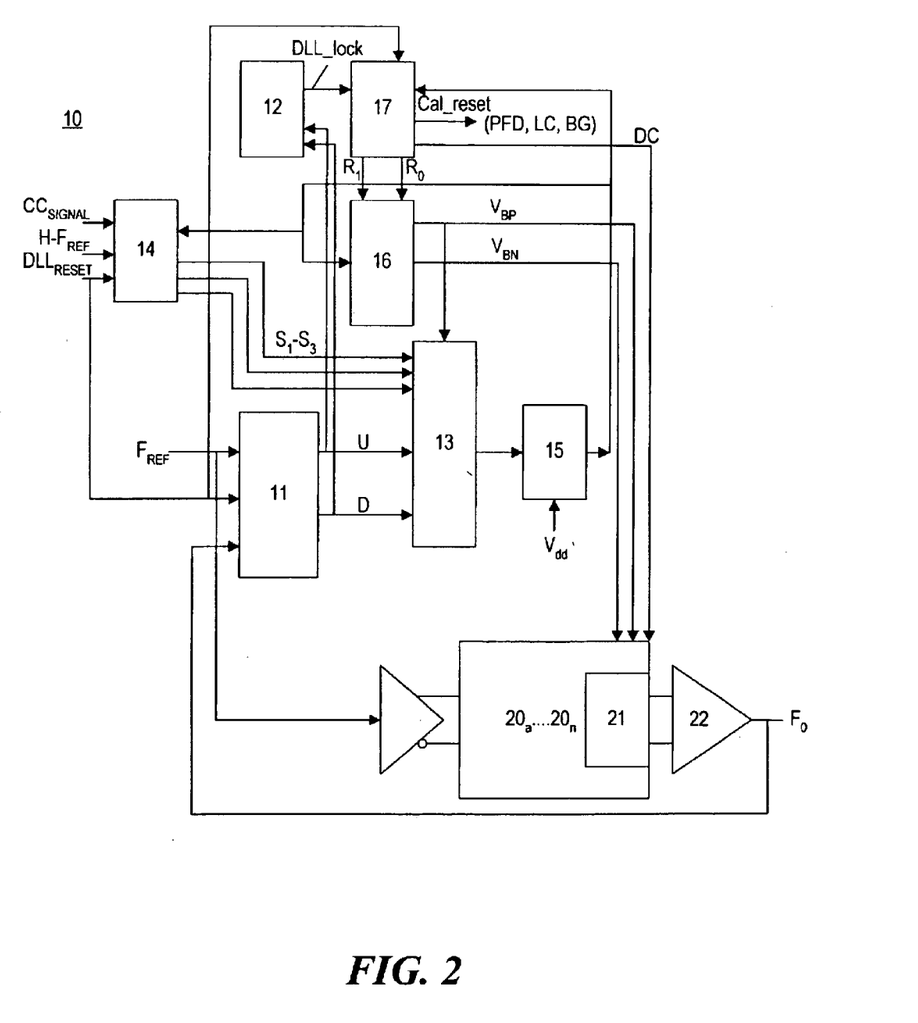
FIG. 2 is a block diagram of the circuit in accordance with the preferred embodiment of the present disclosure.

Referring to FIG. 2, a DLL circuit 10 made in accordance with an embodiment of the present disclosure is shown. The DLL circuit 10 includes a phase frequency detector (PFD) 11, a lock circuit 12, a charge pump 13, a charge pump control circuit 14, a loop filter 15 including a capacitor C1 (not shown), a common bias generator 16, a current range control circuit 17, a delay cell switching circuit 21 and a plurality of delay cells $20_a \ldots 20_n$. The PFD 11 receives a reference signal $F_{ref}$ from an outside source, a reset signal $DLL_{reset}$ and the DLL output signal $F_0$. Coupled to the PFD 11 are the lock circuit 12 and the charge pump 13. As those skilled in the art should know, the PFD 11 determines the phase difference between the reference signal $F_{ref}$ and the DLL 10 output signal $F_0$. If the PFD 11 detects a phase difference between the two input signals $F_{ref}$, $F_0$, the phase error signals U, D are sent to the lock circuit 12 and the charge pump 13. The duration (pulse width) of these output signals U, D depends on the amount of phase error that is detected by the PFD 11.

Figure 3A:
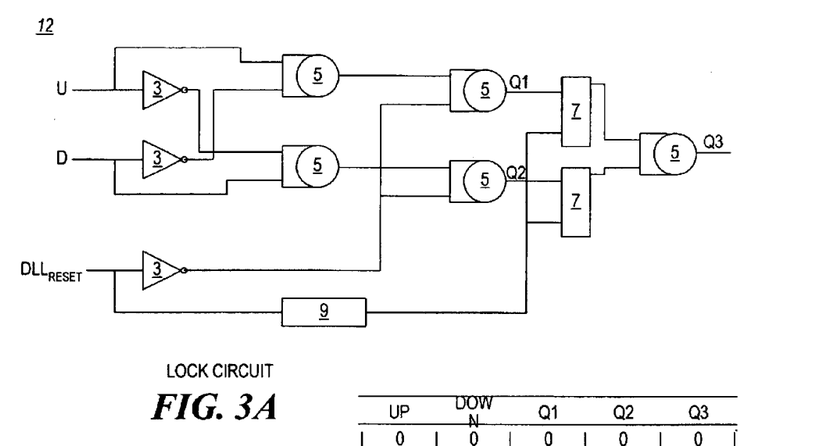
FIG. 3A is a logic gate diagram of the lock circuit in accordance with the preferred embodiment of the present disclosure.

The lock circuit 12, shown in FIG. 3A, is controlled by the phase error signals U, D output from the PFD 11. Coupled to the PFD 11 and the current range control circuit 17, the lock circuit 12 monitors the crossing of the phase of the DLL output signal $F_0$ and the phase of the reference signal $F_{ref}$, as will be disclosed hereinafter. The lock circuit 12 comprises a plurality of invertors 3, a plurality of AND gates 5, two S-R flip flops 7 and a delay 9. When the lock circuit 12 detects the crossing of the phase of the two signals $F_0$, $F_{ref}$, the lock circuit 12 provides an output $Q_3$ to the current range control circuit 17 to remain at the present bias current level. The output $Q_3$ of the lock circuit 12, as the DLL circuit 10 attempts to match the phase of the output signal $F_0$ with the phase of the reference signal $F_{ref}$, is illustrated in the logic table of FIG. 3C.

Figure 3B:
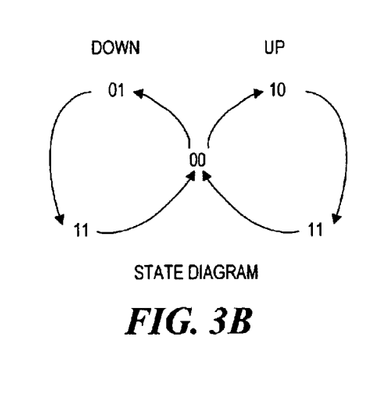
FIG. 3B is a state diagram of the lock circuit inputs in accordance with the preferred embodiment of the present disclosure.
Figure 3C:
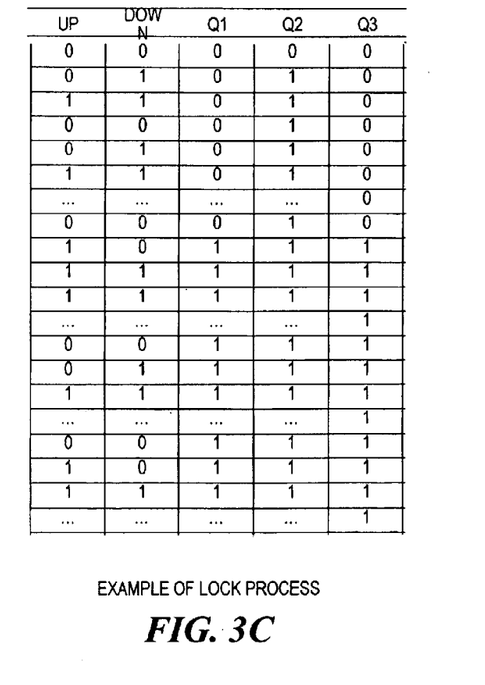
FIG. 3C is a logic table for the lock circuit in accordance with the preferred embodiment of the present disclosure.

Referring to FIGS. 3B and 3C, as the DLL circuit 10 comes out of reset, the error signals U, D are in the neutral state 0, 0. Since the output frequency $F_0$ is out of phase with the reference frequency $F_{ref}$, the error signals U, D go to a state 0, 1 indicating that the loop filter 15 capacitor C1 must be charged. On the subsequent rising edge of the reference frequency $F_{ref}$, the error signals U, D go to a state 1, 1. This state causes the PFD 11 to reset and return the error signals U, D to their neutral state 0, 0. This process continues until the phase of the output frequency $F_0$ passes the phase of the reference frequency $F_{ref}$ which is indicated by the error signals U, D going to a state 1, 0. This condition will signal the lock circuit 12 to output a logical one (1) to the current range control circuit 17, indicating that the current range control circuit 17 should maintain the bias current at the present level which will be described in greater detail hereinafter.

The lock circuit 12 operates to quickly detect the matching of the phases of reference signal $F_{ref}$ and output signal $F_0$. Once this condition is detected, the lock circuit 12 provides the output signal $Q_3$ to the current range control circuit 17 to remain at the present bias current level, the optimal bias current $I_{bias}$ (shown in FIG. 4A) to be output to the plurality of delay cells $20_a \ldots 20_n$. This lock circuit 12 provides fast signal lock detection so that devices using the DLL 10 output signal $F_0$ do not have to delay processing for a longer period of time than necessary, resulting in faster device processing time.

Referring back to FIG. 2, the error signals U, D from the PFD 11 are also forwarded to the charge pump 13. The charge pump 13 outputs a charge current that charges or discharges the capacitor C1 of the loop filter 15 to a voltage level $V_{lpf}$. The charge pump 13 receives the error signals U, D, a bias voltage input $V_{bp}$ from the common bias generator 16, and the logic signals S1, S2, S3 from the charge pump control circuit 14, as will be described in greater detail hereinafter. $V_{bp}$ is a reference bias voltage which controls the charge pump 13 output current. It is well known to those skilled in the art that the charging and discharging of the loop filter 15 capacitor C1 creates a voltage change $V_{lpf}$ across the loop filter 15. As the voltage $V_{lpf}$ increases, the charge pump 13 output current decreases. This voltage change $V_{lpf}$ is a reference for the common bias generator 16 and the current range control circuit 17 to generate the reference signals which control the amount of delay generated by each delay element $20_a \ldots 20_n$.

The logic signals S1, S2, S3 received by the charge pump 13 from the charge pump control circuit 14 are equivalent to 1, 1, 1, respectively. This output allows the charge pump 13 to output a maximum charge current, causing the DLL 10 to have a high frequency response to the error signals U, D. However, when the DLL circuit 10 receives a high frequency reference signal, such as greater than 300 MHz, the charge pump control circuit 14 receives a logic one (1) signal from H-$F_{ref}$, which detects the existence of this high frequency reference signal. The charge pump control circuit 14 converts a charge control signal $CC_{signal}$ and adjusts the outputs of the three logic signals S1, S2, S3, which in turn adjusts the amount of charge current output by the charge pump 13. When H-$F_{ref}$ equals logic one (1), the signals S1, S2, S3 output from the charge pump control circuit 14 may be equivalent to 1, 1, 0 or 1, 0, 1, respectively, for example. The charge control signal $CC_{signal}$ is an outside input signal whose value depends on the device or process for which the DLL 10 output $F_0$ is to be used. The charge pump control circuit 14 converts the charge control signal $CC_{signal}$ to the logic signals S1, S2, S3. This instructs the charge pump 13 to switch out an internal current source (not shown) when the logic signal S1, S2, or S3 associated with the current source is zero (0), thereby dividing the current of the charge pump 13 by a number m (e.g., 3, 6, or 9). The use of the charge pump control circuit 14 when a high frequency input signal is detected provides a reduced frequency response to the error signals U, D as the phase of the output signal $F_0$ is adjusted to match the phase of the input signal $F_{ref}$, providing better jitter performance.

The loop filter 15, which comprises a capacitor C1, is coupled to the current range control circuit 17, the common bias generator 16, and the charge pump 13. This loop filter 15 receives a charge current generated by the charge pump 13 and an outside input voltage $V_{dd}$. As a result of the charging or discharging of the capacitor C1, a voltage $V_{lpf}$ is created and output to the current range control circuit 17 and the common bias generator 16.

Figure 5:
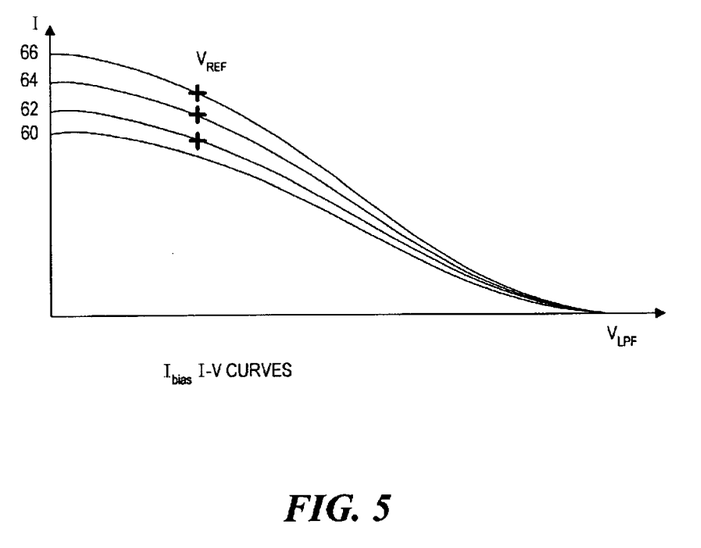
FIG. 5 is an example of a graph of four I-V curves in accordance with the preferred embodiment of the present disclosure.

The current range control circuit 17, coupled to the output of the loop filter 15 and the lock circuit 12, the delay cell switching circuit 21 and the common bias generator 16, comprises two voltage comparators (not shown) and two (2) single bit outputs R0, R1. The current range control circuit 17 receives the loop filter 15 output voltage $V_{lpf}$ and adjusts the level of the bias current $I_{bias}$ generated in the common bias generator 16, through the output leads R0, R1. The voltage comparators in the current range control circuit 17 monitor the voltage $V_{lpf}$ against an internal reference voltage $V_{ref}$ which is indicative of the point where a small change in the voltage $V_{lpf}$ causes a large change in the bias current $I_{bias}$. The reference voltage $V_{ref}$, which can be fixed or variable, is illustrated in the $I_{bias}$ I-V curves 60–66 of FIG. 5. As those skilled in the art should know, each of these curves 60–66 include a nonlinear region where a small increase in the voltage creates a large decrease in the current. This nonlinear region creates a large change in the delay elements $20_a \ldots 20_n$, causing increased jitter within the DLL circuit 10. If the DLL circuit 10 is operated past a certain voltage point $V_{ref}$ on the curves and into the nonlinear region, the amount of jitter will increase and the overall performance of the DLL circuit 10 will decrease. Therefore, when the voltage $V_{lpf}$ is greater than the reference voltage $V_{ref}$, the PFD 11, bias generator 16 and lock circuit 12 receive a local reset signal Cal_reset from the current range control circuit 17 which resets the voltage $V_{lpf}$ to zero (0). The current range control circuit 17 outputs R0, R1 switch states, adjusting the bias current $I_{bias}$ to a lower level.

Initially, when the DLL circuit 10 is reset, the current range control circuit 17 receives a logic zero (0) signal from the lock circuit 12 and signals the bias generator 16 to switch on all four current sources $I_1, I_2, I_3, I_4$, which is indicated by the output 0, 0 for the two output leads R0, R1, respectively. The current range control circuit 17 also resets a delay cell signal DC at the input of a delay cell switching circuit 21, which sets the number of delay cells to the lowest delay level. When the lock circuit 12 detects the crossing of the phase of the reference and output signals $F_{ref}, F_0$, the current control circuit 17 is signaled to lock the common bias generator 16 at the present bias current level, which is the optimal bias current curve for the DLL circuit 10 performance. As disclosed above, when the voltage comparators in the current range control circuit 17 detect that the $V_{lpf}$ is too high, the current range control circuit 17 output leads R0, R1 switch by one (1). For example, after the resetting of the DLL circuit 10, the output leads R0, R1 are equivalent to 0, 0. When the comparator detects the high voltage $V_{lpf}$, the output leads R0, R1 switch to 0, 1, respectively, which indicates that the common bias generator 16 should switch off current source $I_4$. The current range control circuit 17 also outputs an internal reset signal Cal_reset to the PFD 11, the lock circuit 12, and the bias generator 16 which resets the voltage $V_{lpf}$ to zero (0). Each time the voltage comparators of the current range control circuit 17 detect this condition, the output leads R0, R1 increase by one (1) and another current source (for example 13) is switched off. This process continues until the output leads R0, R1 are equivalent to 1, 1, where the only remaining current source is $I_1$. At this point, the current range control circuit 17 outputs a logic one (1) delay cell signal DC to the delay cell switching circuit 21, indicating that the maximum number of delay cells $20_a \ldots 20_n$ should be used. The reset signal Cal_reset is also output, thereby resetting the aforementioned components and the output leads $R_0, R_1$. The current range control circuit 17 again steps through the process described above. Once the current range control circuit 17 reaches the lowest bias current level for the second time, the common bias generator 16 is signaled to lock at the lowest bias current level $I_1$.

If the reference voltage $V_{ref}$ is greater than the loop filter 15 voltage $V_{lpf}$ and the lock circuit output is a logic one (1), the current range control circuit 17 remains at the present bias current level, which is considered the optimal operating point for the process utilizing the DLL 10 output signal Fo. As those skilled in the art should know, even though the current range control circuit 17 is illustrated utilizing two (2) single bit outputs R0, R1, a single two bit output may also be utilized. It should also be obvious to those skilled in the art that even though the current disclosure only utilizes four (4) bias current levels, the current range control circuit 17 can be designed to provide for more or less levels of current control.

Figure 4A:
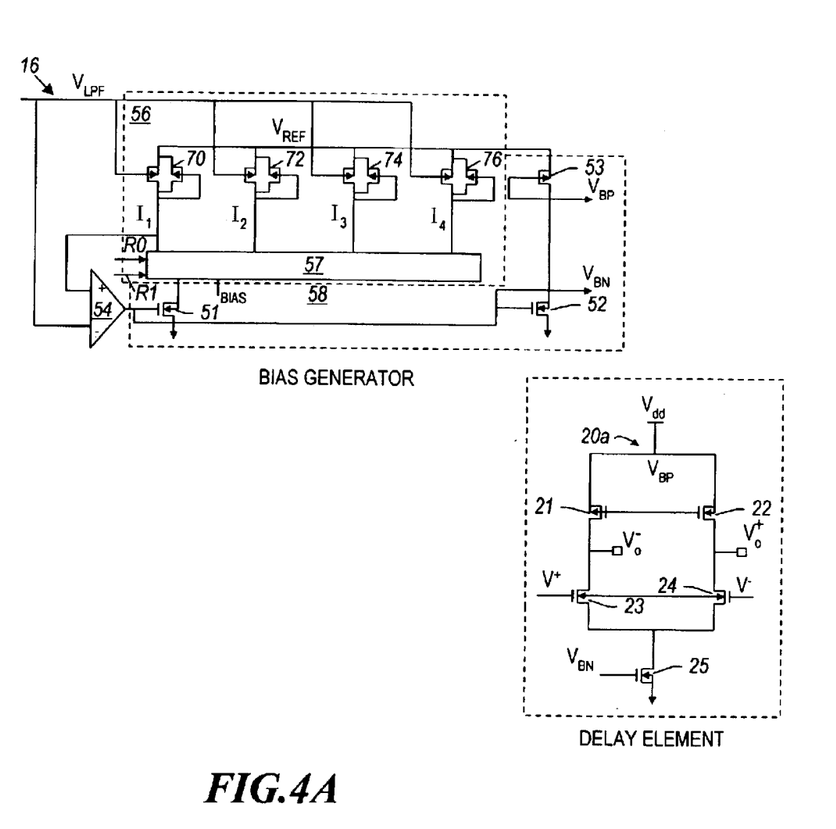
FIG. 4A is a diagram of the bias generator and a delay element in accordance with the preferred embodiment of the present disclosure.
Figure 4B:
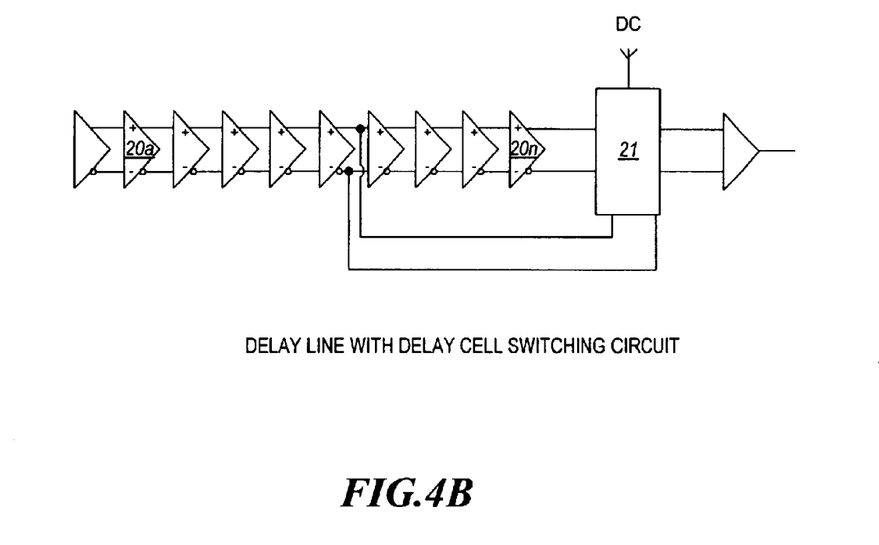
FIG. 4B is a diagram of a representation of the configuration of the delay elements with the switching circuit.

Referring to FIG. 4B, the delay cell $20_a \ldots 20_n$, with a single differential amplifier representing a single differential delay element is shown. The number of delay cells $20_a \ldots 20_n$ utilized by the DLL 10 is determined by the delay cell switching circuit 21. When the DLL 10 is reset, the current range control circuit 17 sends a logic zero (0) delay cell signal DC to the delay cell switching circuit 21, resetting it to the lowest delay cell count. For purposes of the preferred embodiment of the present disclosure, the lowest delay cell count is six (6). When the control circuit 17 sends a logic one (1) delay cell signal DC, the delay cell switching circuit 21 increases the number of delay cells used by the DLL 10 to its maximum count; which for purposes of the present disclosure is twenty 20 delay cells. The minimum and maximum delay cell counts may be changed depending on the device and process. Additionally, even though the present disclosure has only two levels of delay cell counts, minimum and maximum, the switching circuit 21 may provide for more levels.

Since each of the delay elements $20_a \ldots 20_n$ draw transient power, the reduced delay cell count allows the DLL 10 to consume less power because fewer delay cells are used. The delay cell switching circuit 21 coupled to the current range control circuit 17 provides the DLL circuit 10 with more flexibility and faster locking times.

Referring to FIG. 4A, the present disclosure utilizes a single common bias generator 16, comprising a bias current generator 56, a bias voltage generator 58 and a differential amplifier 54. The differential amplifier 54 reduces the noise from the power supply. The differential amplifier provides improved power supply rejection ratio performance. The bias current generator 56 includes four symmetric loads 70, 72, 74, 76 and a switching circuit 57. Each of the symmetric loads 70, 72, 74, 76, which may or may not have the same device width, has as its voltage source $V_{dd}$ and the low pass filter output signal $V_{lpf}$ as its control voltage. The four symmetric loads 70, 72, 74, 76 act as current sources $I_1, I_2, I_3, I_4$. These current sources $I_1, I_2, I_3, I_4$ are switched on and off by the switching circuit 57. The outputs R0, R1 from the current range control circuit 17 dictate to the switching circuit 57 which of the current sources should be on and which should be off. As should be known to those skilled in the art, there are numerous switching circuits that are responsive to a digital input and can be used as described herein. In this manner, the current range control circuit 17 provides four discrete levels of bias current $I_{bias}$. This allows for better control of the DLL circuit 10 by providing the flexibility of varying the current slope without having to vary the delay cell itself. The bias current $I_{bias}$ is output from the bias current generator 56 to the bias voltage generator 58.

The bias voltage generator 58 comprises two n channel transistors 51, 52 and one p channel transistor 53. The gate voltage of the n channel transistors 51, 52 is connected to the output of the differential amplifier 54. This differential amplifier 54 works to eliminate the noise generated by power supply voltage $V_{dd}$. The n channel transistors 51, 52 are configured such that the bias current $I_{bias}$ through transistor 51 is mirrored onto transistor 52 and reflected up to transistor 53. When the bias current $I_{bias}$ is mirrored in this way, two reference voltages are created. The two reference voltages are the bias voltages $V_{bn}$ and $V_{bp}$, which determine the amount of delay for each delay element $20_a \ldots 20_n$. This configuration also provides the bias current $I_{bias}$ from the common bias generator 16 to each delay element $20_a \ldots 20_n$. Using this common bias generator 16 and a selectable number of delay cells $20_a \ldots 20_n$ will provide better linearity in the overall delay of the DLL circuit 10.

Referring still to FIG. 4A, each delay cell $20_a \ldots 20_n$ contains two p channel transistors 21 and 22 and three n channel transistors 23, 24, 25. Transistors 23, 24 act as switches in the delay cell $20_a$ and determine the actual delay for each element based on the bias current $I_{bias}$ via the voltages $V_{bn}$ and $V_{bp}$. The p channel transistors 21, 22 act as current sources for the transistors 23, 24. Transistor 25 acts as a current source as well. The p channel transistors 21 and 22 are biased by the voltage $V_{bp}$. Since the amount of bias current $I_{bias}$ determines the voltage $V_{bp}$, the delay time changes with $V_{bp}$. Transistors 23 and 24 receive a voltage input $V^+$, and $V^-$. The delay elements $20_a \ldots 20_n$ are configured in such a way that the voltage inputs $V^+, V^-$ of the delay elements come from the voltage outputs $V_0^+, V_0^-$ of the preceding delay elements. The voltage outputs $V_0^+$, $V_0^-$ from the last delay element $20_n$ are coupled to a differential amplifier 22.

The current supplied by transistor 22 does not pass through transistor 24 when transistor 24 is "off" (or not conducting). Likewise, when transistor 23 is not conducting, the current provided by transistor 21 does not pass through transistor 23. There are parasitic capacitances at the inputs of transistors 23 and 24 that charge and discharge to affect the voltages $V^+$ and $V^-$, which rise and fall. When transistors 23 and 24 are on and off, respectively, the charge on the parasitic capacitors at the input of transistors 23 and 24 on the subsequent delay cell will be affected. When transistor 23 is turned on, it discharges the parasitic capacitances of the next delay cell and $V_0^-$ changes from $(V_{dd}-V_{ds21})$ to $(0V+V_{ds23}+V_{ds25})$. Likewise, when transistor 24 is off, transistor 22 charges the capacitance of the following delay cell and $V_0^+$ changes from $(0V+V_{ds24}+V_{ds25})$ to $(V_{dd}-V_{ds22})$, the drain to source voltage of transistor 22 at saturation. As is well known to those skilled in the art, the delay provided by the delay cell is equivalent to the duration between turning on transistor 23 and turning off transistor 24, and when the voltages $V^+$ and $V^-$ are equal. When this point is reached, the transistors in the next delay cell are activated. $V_0+$ and $V_0^-$ are the output voltages of each delay cell that provide the input voltages $V^+$, $V^-$ to the next delay cell.

Figure 6:
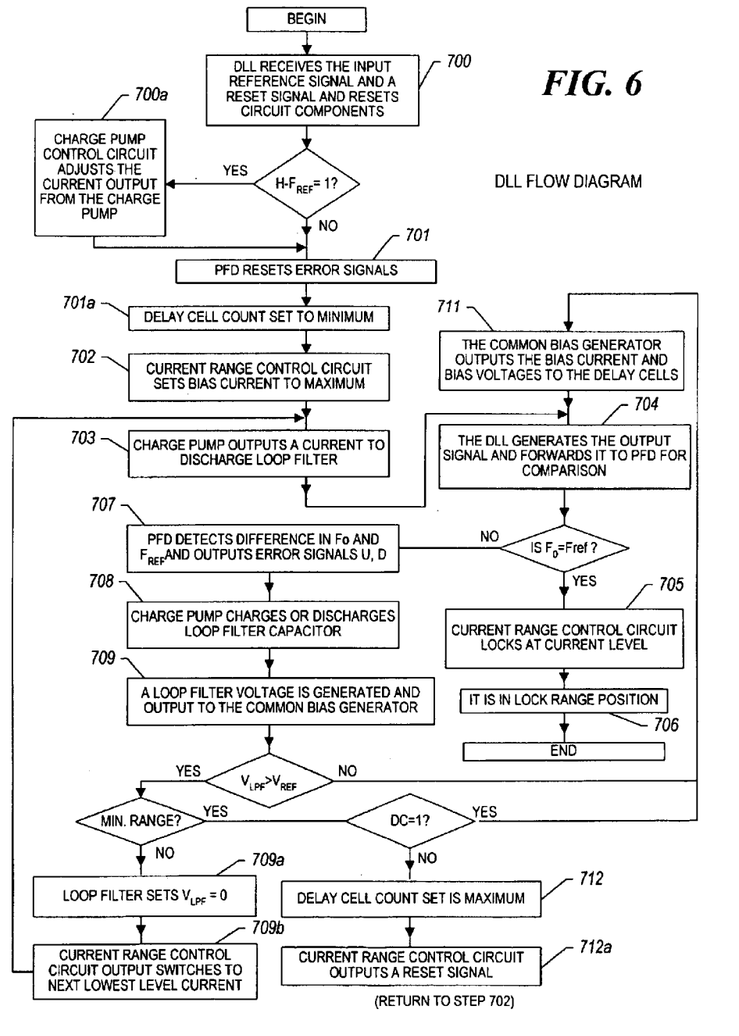
FIG. 6 is a flow diagram in accordance with the preferred embodiment of the present disclosure.

The flow diagram in accordance with present disclosure is illustrated in FIG. 6. The DLL circuit 10 receives a reset signal $DLL_{reset}$ from an external source and resets all DLL 10 circuit components (step 700). If the reference signal is a high frequency reference signal, the $H-F_{ref}$ signal goes high, activating the charge pump control circuit 14. The charge pump control circuit 14 then outputs logic signals S1, S2, S3 to the charge pump 13 to adjust the current in the charge pump 13, in accordance with the charge control signal $CC_{signal}$ (step 700a). The PFD 11 resets the error signals U, D (step 701). The current range control circuit 17 receives the reset signal $DLL_{reset}$ from the outside source and sets the bias current level of the common bias generator 16 to the maximum $(I_1+I_2+I_3+I_4)$ and sets the delay cell count to its minimum (step 701a). The charge pump 13 outputs the appropriate charge current (step 703), generating a DLL circuit 10 delayed output signal $F_0$. The delayed output signal $F_0$ is then output to the PFD 11 to be compared to the reference signal $F_{ref}$ (step 704). If $F_0$ is in phase with $F_{ref}$ the lock circuit 12 signals the current range control circuit 17 to lock at the present current level (step 705). Once the bias current level $I_{bias}$ is locked, the DLL circuit 10 is in lock range position (step 706) and the procedure terminates.

If the two signals $F_{ref}$, $F_0$ are out of phase, the PFD 11 outputs the error signals U, D, whose duration depend on the amount of phase error that is detected between the two signals $F_{ref}$, $F_0$ (step 707). The charge pump 13 receives the error signals U, D from the PFD 11 and the logic signals S1, S2, S3 from the charge pump control circuit 14 and outputs a current, commensurate with those signals, which sources or sinks the loop filter 15 capacitor C1 (step 708). As a result of the charging or discharging of the loop filter 15 capacitor C1, the control voltage $V_{lpf}$ is generated (step 709). If the loop filter 15 voltage $V_{lpf}$ is greater than $V_{ref}$ and the current range control circuit 17 is not in the minimum range with the delay cell signal DC equal to one (1), the current range control circuit 17 outputs a local reset signal Cal_reset, which resets the voltage $V_{lpf}$ to zero (0) (step 709a). The current range control circuit 17 outputs R0, R1 then switch to the next lowest level (step 709b).

If the current range control circuit 17 is at the minimum current level (i.e., R0, R1 is equal to 1,1) and the delay cell signal DC is equal to one (1), the common bias generator 16 outputs the bias current $I_{bias}$ and bias voltages $V_{bp}$, $V_{bn}$ to the plurality of delay cells $20_a \ldots 20_n$ (step 711), which generates the DLL circuit 10 output signal $F_0$ (step 704).

If the delay cell signal is equal to zero (0) when the current range control circuit 17 is at the minimum current level (i.e., R0, R1 is equal to 1,1), the current range control circuit 17 signals the switching circuit 21 to use the maximum number of delay cells (step 712) (DC=1) and outputs the internal reset signal Cal_reset (712a). When the delay cell signal DC switches from zero (0) to one (1), the process is started again (step 702).

This design of the DLL circuit 10, in accordance with the preferred embodiment, will achieve a wide operating frequency range with a short lock in time and good jitter performance over a wide power supply voltage range. The differential DLL, operating in the biasing current mode, provides a much wider operating frequency range with high common-mode noise immunity. The common biasing technique provides the necessary bias with less sensitivity to temperature and process variations. It also provides better power supply rejection ratio and current range calibration regulation when the power supply droops or when process variations change.

Figure 7:
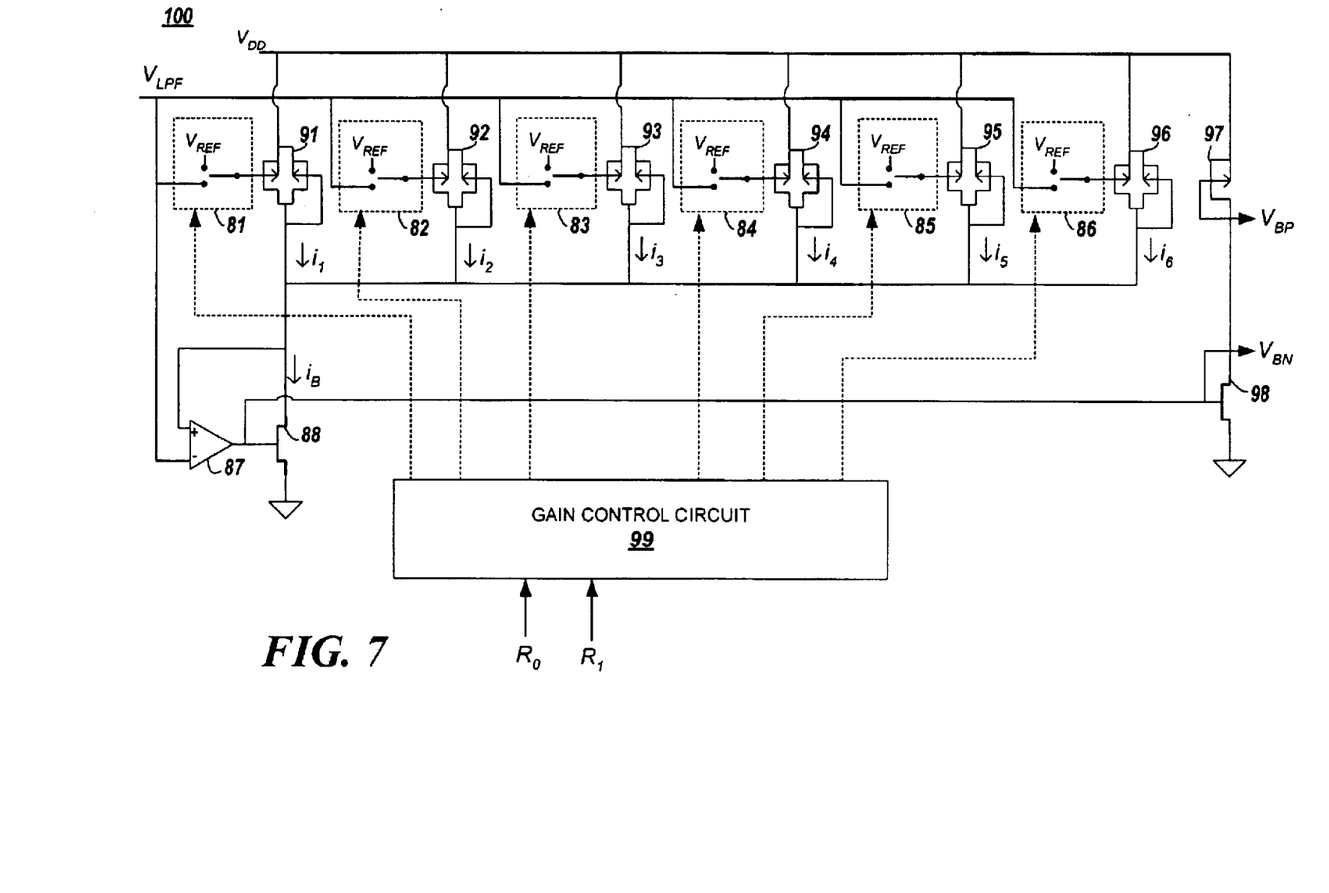
FIG. 7 is a diagram of a bias generator, according to one embodiment of the present disclosure.

Referring now to FIG. 7, a block diagram of a bias generator is shown and referenced generally as bias generator 100, in accordance with one embodiment of the present disclosure. Bias generator 100 includes loads 91–96, switches 81–86, transistors 88, 97, and 98, differential amplifier 87, and gain control circuit 99.

Bias generator 100 operates similar to the bias generator 16 of FIG. 4A. However, wherein the bias currents of the various current levels of the bias generator 16 were set to go to zero, the bias currents of most of the current levels of bias generator 100 are designed to remain within set current limits. Each of the current levels of bias generator 100 allows a smaller range of currents than current levels of bias generator 16. Accordingly, each of the current levels of bias generator 100 have smaller values of gain factors ($K_{VCDL}$) than current levels of bias generator 16, when using low source voltages, such as $V_{DD}$ near one volt. The gain factor $K_{VCDL}$ represents the resulting conversion factor of the delay element control circuit, such as delay cell switching circuit 21 and delay cells $20_a \ldots 20_n$. Lower $K_{VCDL}$ values leads to lower jitter and better control over feedback stability, resulting in an increase in the range of operational frequencies. In combination with the current range control circuit 17, the gain control circuit 99 allows a DLL to operate over a much larger range of frequencies than a similar DLL without circuits 17 and 99.

It should be appreciated that the value of $K_{VCDL}$ in a particular current level can be calculated and calculations of $K_{VCDL}$ are known in the art. For example, the representation of $K_{VCDL}$ as described in one embodiment of the present disclosure is based on the following equation, referenced as Equation 1.

$$Kvcdl = \frac{d}{dV_{LPF}}\left(N\frac{(V_H - V_L) - V_d}{2} \cdot \frac{C_L}{g_{FIXED} + g_{DYNAMIC}}\right) \quad \text{(Equation 1)}$$

In Equation 1, $g_{FIXED}$ and $g_{DYNAMIC}$ refer to the CMOS channel conductance of the fixed current sources (connected to $V_{REF}$) and of the dynamic current sources connected to $V_{LPF}$), respectively. $V_{LPF}$ is the voltage value across the low pass filter 15. $V_H$ and $V_L$ are the maximum and minimum values, respectively, of the output ($V_0^+$ and $V_0^-$) of delay cell 20. Vd is the voltage difference ($V_O^+ - V_O^-$) and can be greater than or equal to zero. N represents the number of delay cells 20 that make up the VCDL 18, and $C_L$ represents the capacitive load seen by each output of delay cells 20.

Gain control circuit 99 operates similar to switching circuit 57 (FIG. 4A). However, instead of switching on and off current sources from the loads, such as symmetric loads 70, 72, 74 and 76, gain control circuit 99 switches voltage input sources for each of the loads 91–96. While loads of bias generator 16, symmetric loads 70, 72, 74, and 76, were symmetric, loads 91–96 of bias generator 100 are not necessarily symmetric in that different amounts of current can be provided from different loads of loads 91–96. Thus, varying amounts of fixed currents for the different currents can be provided, maintaining a similar level of varying current for each current range keeping $K_{VCDL}$ similar in all current ranges. Based on values of R0 and R1, which may be provided by current range control circuit 17, the gain control circuit 99 selects voltages for individual loads of loads 91–96. For each load of loads 91–96, the current range control circuit can provide either a fixed voltage reference $V_{REF}$, $V_{LPF}$ (from low pass filter 15), or $V_{DD}$, as in the following table, Table 1.

TABLE 1

| $R_0$ | $R_1$ | CH1 | CH2 | CH3 | CH4 | CH5 | CH6 |
|---|---|---|---|---|---|---|---|
| 0 | 0 | $V_{LPF}$ | $V_{LPF}$ | $V_{REF}$ | $V_{REF}$ | $V_{REF}$ | $V_{DD}$ |
| 0 | 1 | $V_{DD}$ | $V_{LPF}$ | $V_{LPF}$ | $V_{REF}$ | $V_{REF}$ | $V_{REF}$ |
| 1 | 0 | $V_{DD}$ | $V_{DD}$ | $V_{LPF}$ | $V_{REF}$ | $V_{REF}$ | $V_{DD}$ |
| 1 | 1 | $V_{DD}$ | $V_{DD}$ | $V_{DD}$ | $V_{LPF}$ | $V_{DD}$ | $V_{DD}$ |

As shown in Table 1, for each current range specified by the current range control circuit, either $V_{REF}$, $V_{LPF}$, or $V_{DD}$, can be assigned to each of the specified loads, the loads 91–96 corresponding to channels CH1–CH6 in the table, through the use of switches 81–86, respectively. Setting a voltage input source of $V_{LPF}$ to a particular load allows current generated from the particular load to vary with the $V_{LPF}$ signal. Setting a voltage input source of $V_{REF}$ to a particular load allows the current generated by the particular load to be fixed. Alternatively, the gain control circuit 99 can also disable voltage inputs $V_{LPF}$ and $V_{REF}$ and provide $V_{DD}$ to a particular load, effectively shutting off current generated from that particular load. Fixed current provided by some of the loads of loads 91–96 set a minimum current value for a particular current level, as illustrated in the graph in FIG. 8. It should be noted that the device widths for loads 91–96 may be the same or different for each load. For example, in one embodiment, the device widths for loads 95 and 96 are smaller than the device widths for loads 91–94. Furthermore, it should be appreciated that other methods of providing varying current levels can be used without departing from the scope of the present disclosure.

Figure 8:
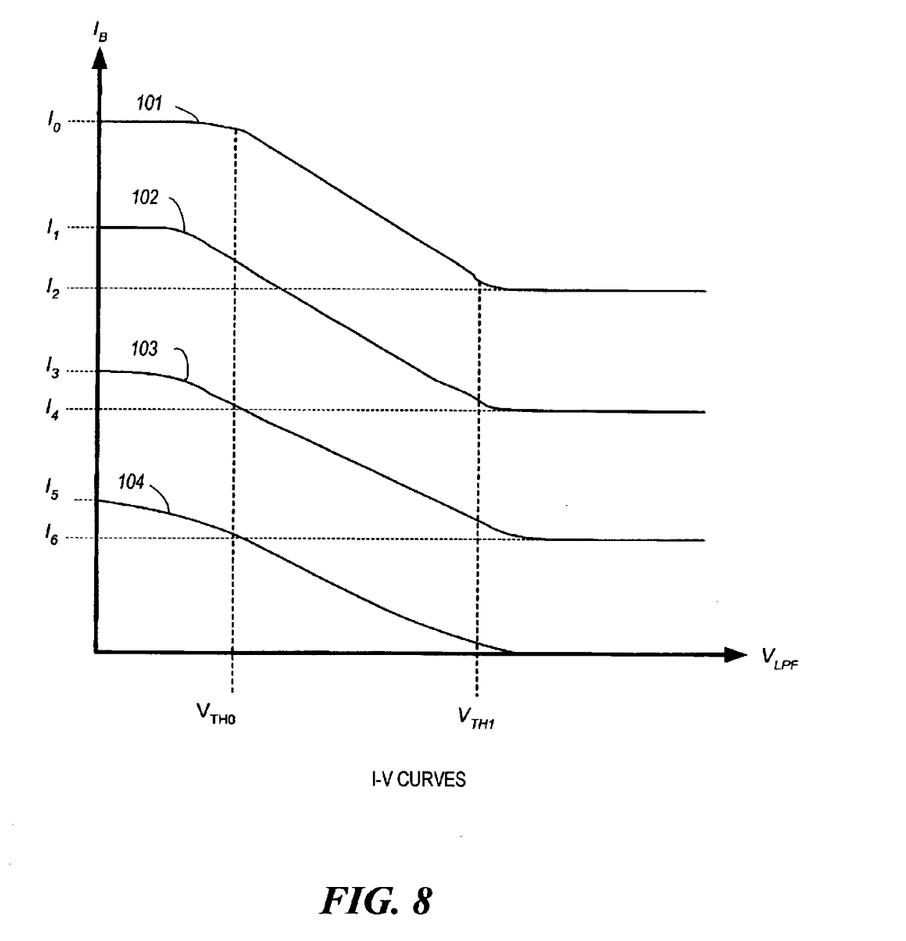
FIG. 8 is an example of a graph of four I-V curves in accordance with one embodiment of the present disclosure.

In the graph of FIG. 8, each of the current levels are shown as I-V curves 101–104. Curve 101 is indicative of a curve from the current level with $R_0$ and $R_1$ having values of 0,0, respectively. Curve 102 is indicative of a curve from the current level with $R_0$ and $R_1$ having values of 0,1, respectively. Curve 103 is indicative of a curve from the current level with $R_0$ and $R_1$ having values of 1,0, respectively. Curve 104 is indicative of a curve from the current level with $R_0$ and $R_1$ having values of 1,1, respectively. Each current level has a fixed range of current. For example, curve 101 only operates a current $I_B$ between $I_0$ and $I_2$. Curve 102 operates with a current $I_B$ between $I_1$ and $I_4$. Curve 103 operates with a current $I_B$ between $I_3$ and $I_6$. The value of $I_B$ is allowed to go to zero in curve 104, wherein the range of $I_B$ is within $I_5$ and zero.

It should be noted that the current levels for each of the curves 101–104 overlap with adjacent curves. For each I-V curve 101–104, the full range of voltage associated with the $V_{LPF}$ is not desirable for use. While $V_{LPF}$ is capable of ranging from the full level of the supplied power level, noise and device limitations result in unreliable values of $K_{VCDL}$ near the limits of the power supply (near 0 V and the maximum voltage of the power supply $V_{DD}$). For example, it may be desired for transistors associated with the delay cells $20_a \ldots 20_n$ to be in a saturated mode of operation for reliable use. The values of $K_{VCDL}$ are unreliable and unstable below a first threshold, $V_{TH0}$, and above a second threshold $V_{TH1}$. Therefore, for each curve 101–103, the usable range of $V_{LPF}$, during which a DLL such as DLL 10 is in a locked mode of operation, is between limits such as $V_{TH0}$ and $V_{TH1}$. The locked mode of operation indicates when the DLL is tracking a reference signal, such as $F_{REF}$. Despite device limitations, the final curve 104 can be allowed to reach zero, regardless of an increase in $V_{LPF}$ greater than the $V_{TH1}$. As previously discussed in reference to the I-V curves of FIG. 5, current range control circuit 17 can monitor the value of $V_{LPF}$ and switch to a next curve when the value of $V_{LPF}$ approaches the value of $V_{TH1}$. Once the current range control circuit 17 switches to a next current range, a reset signal, Cal_reset, is provided to reset $V_{LPF}$ to zero. $V_{LPF}$ then ramps up in voltage as the delay cells $20_a \ldots 20_n$ are operated in the next current range. It should be noted that while the same limits are shown for each of the curves 101–104, different limits can be used for each of the curves, without departing from the scope of the present disclosure.

Based on the current ranges of $I_B$, the delay cells $20_a \ldots 20_n$ can generate a particular range of phases. As portions of the full range of voltage for $V_{LPF}$ are not usable with a single current range, the current ranges associated with adjacent curves 101–104 overlap. For example, the highest current limit for curve 102 is $I_1$, which is within the current range of curve 101. Similarly, the highest current for curve 103 is $I_3$, which is within the current range of curve 102. Accordingly, ranges of phases generated by the delay cells $20_a \ldots 20_n$ also overlap for each of the current levels.

Referring back to FIG. 7, differential amplifier 87 operates similar to differential amplifier 54 and removes noise from bias current $i_B$. Bias current $i_B$ is converted to bias voltages $V_{BP}$ and $V_{BN}$, through the use of n-channel transistors 88 and 98 and p-channel transistor 97. The bias voltages, provided to delay cells $20_a \ldots 20_n$, control the gain factor, $K_{VCDL}$, of the delay cells $20_a \ldots 20_n$. As $V_{BP}$ and $V_{BN}$ are limited in voltage, dependent on the current limits of $I_B$ in a particular current level, a resultant $K_{VCDL}$ does not have to operate for a full range of the supply voltage $V_{DD}$. While prior-art devices forced the $K_{VCDL}$ to be used for a full range of current, such as current $I_0$ to zero amps, the bias generator 100 allows a $K_{VCDL}$ generated to work in a smaller range while not reducing the operational range of a DLL, such as DLL circuit 10. For example, a $K_{VCDL}$ for a first current level, such as the current level associated with curve 101 only has to operate within a current range of $I_0$ and $I_2$. Within each range of current, the delay cells $20_a \ldots 20_n$ operates in a fixed range of phases. However, as each of the different current levels can be used, the delay cells $20_a \ldots 20_n$ can still be operated over a full range of phases. Conventional low power devices had large $K_{VCDL}$s which caused high jitter and poor feedback stability. The present embodiment of FIG. 7 allows for smaller subsets of frequencies for small current ranges to be used to allow each $K_{VCDL}$ associated with a particular current level to be small while still providing a full range of operation, by switching to other current levels.

While a specific embodiment of the present disclosure has been shown and described, many modifications and variations can be made by one skilled in the art without departing from the spirit and scope of the disclosure. The above description serves to illustrate and not limit the particular form in any way.

What is claimed is:

1. A delay locked loop (DLL) circuit comprising:
   a plurality of differential delay elements configured to generate a delayed output signal relative to an input reference signal;
   a phase detector configured to detect a phase difference between a phase of the input reference signal and a phase of the delayed output signal and produce an error signal; and
   a bias generator responsive based on the error signal to produce first and second bias voltages to control the plurality of differential delay elements, wherein the bias generator comprises:
      a bias current generator having at least one fixed voltage-controlled current source and at least one dynamic voltage-controlled current source to generate a bias current based upon the error signal; and
      a bias voltage generator for receiving the bias current from the bias current generator and generating the first and second bias voltages.

2. The DLL circuit as recited in claim 1, wherein in a first mode of operation of the bias generator, a first bias current is generated, and in a second mode of operation, a second bias current is generated, wherein the first bias current is used to control the plurality of differential delay elements in a first current range, including a first current value and a second current value, the first current value being greater than the second current value, and the second bias current is used to control the plurality of differential delay elements in a second current range including a third current value and a fourth current value, the third current value being greater than the fourth current value, further wherein, first current range overlaps the second current range, the first current value is outside the second current range, and the fourth current value is not in the first current range.

3. The DLL circuit as recited in claim 2, wherein the first current range includes a first gain constant value associated with the DLL circuit, and the second current range includes a second gain constant value, different from the first gain constant value, associated with the DLL circuit.

4. The DLL circuit as recited in claim 2, wherein the first current range includes a first gain constant value associated with the DLL circuit, and the second current range includes a second gain constant value, approximately similar to the first gain constant value, associated with the DLL circuit.

5. A delay locked loop (DLL) circuit comprising:
   a plurality of differential delay elements configured to generate a delayed output signal relative to an input reference signal;
   a phase detector configured to detect a phase difference between the input reference signal and the delayed output signal and produce an error signal;
   a bias generator responsive based on the error signal wherein in a first mode of operation, a first bias current is generated, and in a second mode of operation, a second bias current is generated, wherein the first bias current is used to control the plurality of differential delay elements in a first current range, including a first current value and a second current value, the first current value being greater than the second current value, and the second bias current is used to control the plurality of differential delay elements in a second current range including a third current value and a fourth current value, the third current value being greater than the fourth current value, further wherein, first current range overlaps the second current range, the first current value is outside the second current range, and the fourth current value is not in the first current range.

6. The DLL circuit as recited in claim 5, wherein the first mode of operation includes a first gain constant value associated with the DLL circuit and the second mode of operation includes a second gain constant value, different from the first gain constant value, associated with the DLL circuit, further wherein the first gain constant value represents a first delay for a voltage value, and the second gain constant value represents a second delay, different from the first delay, for the voltage value.

7. The DLL circuit as recited in claim 5, wherein the first mode of operation includes a first gain constant value associated with the DLL circuit and the second mode of operation includes a second gain constant value, approximately similar to the first gain constant value, associated with the DLL circuit, further wherein the first gain constant value represents a first delay for a voltage value, and the second gain constant value represents a second delay, different from the first delay, for the voltage value.

8. The DLL circuit as recited in claim 5, wherein the bias current generator further is used in a third operation to generate a third bias current to operate the plurality of differential delay elements in a third current range including a fifth current value and a sixth current value, the fifth current value being greater than the sixth current value, wherein the fifth current value is within the second current range and the third current range and the sixth current value is outside of the second current range.

9. The DLL circuit as recited in claim 8, wherein the first current range includes a first gain constant value associated with the DLL circuit, the second current range includes a second gain constant value, different from the first gain constant value, associated with the DLL circuit, and the third current range includes a third gain constant value, different from the first gain constant value and the second gain constant value, associated with the DLL circuit.

10. The DLL circuit as recited in claim 8, wherein the first current range includes a first gain constant value associated with the DLL circuit, the second current range includes a second gain constant value, approximately similar to the first gain constant value, associated with the DLL circuit, and the third current range includes a third gain constant value, approximately similar to the first gain constant value and the second gain constant value, associated with the DLL circuit.

11. The DLL circuit as recited in claim 8, wherein the bias current generator further is used in a fourth mode of operation to generate a fourth bias current to operate the plurality of differential delay elements in a fourth current range including a seventh current value and an eighth current value, the seventh current value being greater than the eighth current value, wherein the seventh current value is within the third current range and the fourth current range and the eighth current value is outside of the third current range.

12. The DLL circuit as recited in claim 5, wherein the plurality of differential delay elements are controlled in a manner that modifies the phase of the output delayed output signal initially at a relatively low phase delay.

13. The DLL circuit as recited in claim 5, further comprising a fast lock circuit, responsive to the error signal, for detecting when the phase of the delayed output signal passes the phase of the input reference signal.

14. The DLL circuit as recited in claim 13, further comprising:
a charge pump to generate a charge current which charges and discharges a loop filter; and
a charge pump control switch associated with the fast lock circuit and charge pump for reducing the charge current when the phase of the delayed output signal passes the phase of the input reference signal, wherein the bias generator is responsive to the charging and discharging of the loop filter.

15. The DLL circuit as recited in claim 5, further comprising a low pass filter to generate a low pass filter voltage based on the error signal, wherein the mode of operation is based on a comparison of the value of the low pass filter voltage to a value of a fixed reference voltage source.

16. The DLL circuit as recited in claim 5, wherein the DLL is operated in the first mode of operation prior to operation in the second mode of operation.

17. The DLL circuit as recited in claim 5, wherein the bias generator comprises a first load and a second load for generating the first bias current and the second bias current.

18. The DLL circuit as recited in claim 17, wherein, when in the first mode of operation, a first voltage is applied to the first load and a second voltage is applied to the second load to contribute current from the first load and the second load to the first bias current.

19. The DLL circuit as recited in claim 18, wherein, when in the second mode of operation, the first voltage is applied to the second load and no significant voltage is applied to the first load to contribute current from the second load to the second bias current.

20. The DLL circuit as recited in claim 18, wherein a value of the first voltage and a value of the second voltage are the same.

21. The DLL circuit as recited in claim 18, wherein a value of the first voltage and a value of the second voltage are different.

22. The DLL circuit as recited in claim 18, further comprising a low pass filter to generate a low pass filter voltage based on the error signal, wherein the first voltage is representative of the low pass filter voltage and the second voltage is representative of a fixed reference voltage.

23. A method of operating a delay locked loop (DLL) circuit comprising:
biasing the DLL circuit to operate over a first current range comprising a first and second current value, the first current value being greater than the second current value; and
biasing the DLL circuit to operate over a second current range comprising a third and a fourth current value, the third current value being greater than the fourth current value; wherein the first current range overlaps the second current range, the first current value is outside the second current range, and the fourth current value is not in the first current range.

24. The method as recited in claim 23, wherein the DLL circuit is used to generate an output signal based on a reference signal received by the DLL circuit, wherein an error signal is used to represent a phase difference between the output signal and the reference signal.

25. The method as recited in claim 24, wherein the first current range includes a first gain constant value associated with the DLL circuit and the second current range includes a second gain constant value, different from the first gain constant value, associated with the DLL circuit, further wherein the first gain constant value and the second gain constant value represent a range of values of delay added to the output signal generated given a value of input voltage applied to a plurality of differential delay elements.

26. The method as recited in claim 24, wherein the first current range includes a first gain constant value associated with the DLL circuit and the second current range includes a second gain constant value, approximately similar to the first gain constant value, associated with the DLL circuit, further wherein the first gain constant value and the second gain constant value represent a range of values of delay added to the output signal generated given a value of input voltage applied to a plurality of differential delay elements.

27. The method as recited in claim 26, wherein the value of the input voltage is based on the error signal.

28. The method as recited in claim 24, wherein the DLL circuit is biased to operate in the first current range in a first mode of operation and the DLL circuit is biased to operate in the second current range in a second mode of operation.

29. The method as recited in claim 28, wherein the mode of operation is based on a value error signal.

30. The method as recited in claim 28, wherein the DLL circuit is operated in the first mode of operation prior to the second mode of operation.

31. The method as recited in claim 23, wherein the first current range includes a first change in current within operating low pass filter voltages and the second current range includes a second change in current within operating low pass filter voltages, wherein the first change in current is greater than the second change in current.

32. The method as recited in claim 23, further comprising:
biasing the DLL circuit to operate over a third current range comprising a fifth and sixth current value, the fifth current value being greater than the sixth current value; wherein
the fourth current value is within the second and third current range, and the fifth current value is within the second and third current range, and further wherein the sixth current value is outside of the second current range.

33. The method as recited in claim 23, wherein the first current range includes a first gain constant value, associated with the DLL circuit, the second current range includes a second gain constant value, different from the first gain constant value, associated with the DLL circuit, and the third current range includes a third gain constant value, different from the first gain constant value and the second gain constant value, associated with the DLL circuit.

34. The method as recited in claim 23, wherein the first current range includes a first gain constant value, associated with the DLL circuit, the second current range includes a second gain constant value, approximately similar to the first gain constant value, associated with the DLL circuit, and the third current range includes a third gain constant value, approximately similar to the first gain constant value and the second gain constant value, associated with the DLL circuit.

* * * * *